(12) United States Patent
Wang et al.

(10) Patent No.: US 10,288,759 B2
(45) Date of Patent: May 14, 2019

(54) CONTACTLESS SEMSOR

(71) Applicant: Mitsubishi Electric Research Laboratories, Inc., Cambridge, MA (US)

(72) Inventors: Bingnan Wang, Belmont, MA (US);
Koon Hoo Teo, Lexington, MA (US);
Philip Orlik, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 290 days.

(21) Appl. No.: 15/210,175

(22) Filed: Jul. 14, 2016

(65) Prior Publication Data
US 2018/0017695 A1     Jan. 18, 2018

(51) Int. Cl.
| | |
|---|---|
| *G01B 7/02* | (2006.01) |
| *G01D 5/20* | (2006.01) |
| *G01V 3/02* | (2006.01) |
| *H03K 17/95* | (2006.01) |

(52) U.S. Cl.
CPC ............. *G01V 3/02* (2013.01); *G01B 7/023* (2013.01); *G01D 5/20* (2013.01); *G01D 5/202* (2013.01); *G01D 5/2026* (2013.01); *G01D 5/2053* (2013.01); *H03K 2017/9527* (2013.01)

(58) Field of Classification Search
CPC ........ G01V 3/02; G01D 5/202; G01D 5/2026; G01D 5/20; G01D 5/2053; G01B 7/023; H03K 2017/9527
USPC ........................................ 324/207.23, 207.25
See application file for complete search history.

(56) References Cited

U.S. PATENT DOCUMENTS

| | | | |
|---|---|---|---|
| 6,727,691 B2 | 4/2004 | Goldfine et al. | |
| 7,276,897 B2 | 10/2007 | Lee | |
| 7,449,878 B2 | 11/2008 | Lee | |
| 7,538,544 B2 * | 5/2009 | Lee ..................... | G01D 5/2053 324/207.17 |

(Continued)

FOREIGN PATENT DOCUMENTS

DE         4311973 A1     2/1997

OTHER PUBLICATIONS

Liu et al. "Resonant Coupling of a Passive Inductance-Capacitance-Resistor Loop in Coil-Based Sensing Systems," IEEE Sensors Journal, IEEE Service Center, New York, NY, US. vol. 12, No. 12. Dec. 1, 2012. pp. 3417-3423. XP011472027.

*Primary Examiner* — Farhana A Hoque
(74) *Attorney, Agent, or Firm* — Gene Vinokur; James Mcaleenan; Hironori Tsukamoto

(57) ABSTRACT

A sensor including a set of coils. The set of coils include a first coil and a second coil, wherein the first coil upon receiving energy, generates an electromagnetic near-field, such that the electromagnetic near-field provides at least a portion of the energy to the second coil through inductive coupling, inducing a current to pass through the set of coils. Further, a detector for measuring a voltage across at least one of the first coil or the second coil, wherein the detector includes a voltmeter. Finally, a processor for detecting a presence of a target structure in proximity to the set of coils upon detecting a change in a value of the voltage, wherein the target structure is an electromagnetic structure moving at a distance from the set of coils.

18 Claims, 11 Drawing Sheets

(56) References Cited

U.S. PATENT DOCUMENTS 8,020,453 B2 9/2011 Kreit et al.
2013/0328516 A1 12/2013 Prussmeier et al.

* cited by examiner

CONTACTLESS SEMSOR

FIELD

The present disclosure relates to a position sensor, and more particularly to a contactless sensor for determining a presence and/or relative position of a target structure in a proximity to the sensor.

BACKGROUND

Position sensors, such as brushes, slip rings, or wire conductors, often employ contacts to indicate the position of a movable member. The elimination of contacts is desirable and can reduce electrical noise and disturbances caused by sliding electric contact. The contactless sensors maintain a gap between the sensor and a target structure, which can be challenging to maintain the sensing range in the presence of such a physical gap.

Examples of contactless sensors include capacitance-based position sensors, laser-based position sensors, eddy-current sensing position sensors, and linear displacement transducer-based position sensors. While each type of position sensor has its advantages, each type of the sensor may be best suited for a particular application. For example, the size of capacitors can make the sensor impractical when the position sensor must be small in size. The optical sensor can fail in the presence of dirt or grease. Magnetic sensors require precision housings and mechanical assembly to avoid errors caused by magnet or sensor misalignment, which can be difficult in some applications. In addition, in some applications, the size of the gap between the sensor and the target structure can change with time, and the location of the target structure can cause problems to the accuracy of some linear position sensors.

Accordingly, there is a need for a contactless sensor for determining a presence and/or relative position of a target structure arranged at a different distance from the sensor.

SUMMARY

Some embodiments are based on recognition that the magnetic flux of an electromagnetic near field generated during inductive coupling is sensitive to any variations in the electromagnetic near-field. The variations in the electromagnetic near-field caused by the changes of the magnetic flux can be detected by, e.g., by measuring the voltage of across the coil caused by the current induced by the magnetic flux via inductive coupling.

Some embodiments are based on realization that a presence of an external electromagnetic structure moving within the electromagnetic near-field disturbs the magnetic field and thus can be detected based on the changes in the measurements of the voltage. For example, the coupling of the target structure that changes the shape of the magnetic near-field, in turn changes the current in the connected coils generated by that near-field. Moreover, the effect of such a presence also affects the entire near-field making such detection less sensitive to the distance between the source, i.e. sensing coil, generating the near-field and the target structure. In other words, the distance between the source, i.e. sensing coil, generating the near-field and the target structure is increased. In such a manner, the presence of the target structure within the near field, even at a relatively great distance from the source, can be detected. However, some embodiments are based on recognition that for some applications it is desirable to increase this distance even further.

Some embodiments are based on realization that a set of multiple inductively coupled coils can induces a greater amount of an electromagnetic near-field and thus increase the range for sensing the presence of the target structure. Moreover, if the magnetic flux induces current over multiple inductively coupled coils, then the magnitude and/or differences between the voltages of different coils are indicative of the relative position of the target structure within the near field. For example, a trajectory of potential movement of the target structure can be sampled to determine a combination of voltages of the connected coils corresponding to specific position of the target structure on the trajectory. The disclosure relates generally to a position sensor, and more particularly to a contactless sensor for determining a presence and/or relative position of a target structure in a proximity to the sensor.

Accordingly, one embodiment of the present disclosure discloses a sensor including a set of coils. The set of coils include a first coil and a second coil, wherein the first coil upon receiving energy, generates an electromagnetic near-field, such that the electromagnetic near-field provides at least a portion of the energy to the second coil through inductive coupling, inducing a current to pass through the set of coils. Further, a detector for measuring a voltage across at least one of the first coil or the second coil. Finally, a processor for detecting a presence of a target structure in proximity to the set of coils upon detecting a change in a value of the voltage, wherein the target structure is an electromagnetic structure moving at a distance from the set of coils.

Another embodiment of the present disclosure discloses a sensor including a set of coils. The set of coils include a first coil and a second coil, wherein the first coil upon receiving energy, generates an electromagnetic near-field, such that the electromagnetic near-field provides at least a portion of the energy to the second coil through inductive coupling, inducing a current to pass through the set of coils. Further, wherein at least 10 percent of an outer surface area of the second coil is adjacent to an outer surface area of the first coil. A detector for measuring a voltage across at least one of the first coil and second coil. Finally, a processor for detecting a presence of a target structure in proximity to the set of coils upon detecting a change in a value of the voltage, wherein the target structure is an electromagnetic structure moving at a distance from the set of coils.

According to another embodiment of the present disclosure, a method for determining a presence and/or a relative position of a target structure in a proximity to a sensor. The sensor includes a set of coils, wherein the set of coils include a first coil and a second coil. The first coil upon receiving energy, generates an electromagnetic near-field, wherein the electromagnetic near-field provides at least a portion of the energy to the second coil through inductive coupling, inducing a current to pass through the set of coils. Wherein a detector for measuring a voltage across at least one of the first coil or the second coil. The method including using a processor for detecting a presence of a target structure in proximity to the set of coils upon detecting a change in a value of the voltage. Wherein the target structure is an electromagnetic structure moving at a distance from the set of coils. Further, recording, by the processor, if there is no change in the value of the voltage for the set of coils and storing in a memory, wherein the memory is in communication with the processor. Detecting, by a detecting unit, a measured value of the voltage of the set of coils, and sending the measured value of the voltage of the set of coils to the processor. Comparing, by the processor, the measured value of the voltage of the set of coils with historically stored reference values. Determining, by the processor, if there is no change in the value of the voltage for the set of coils, if no change, then no presence and/or no relative position of the target structure in the proximity to the sensor. Determining, by the processor, if there is detected change in the value of the voltage for the set of coils, upon determining the detected change, then the target structure is present and a position of the target structure is determined by an amount of change in value of the voltage of the set of coils, indicating if the target structure is at a zero position or at another position.

Further features and advantages will become more readily apparent from the following detailed description when taken in conjunction with the accompanying drawings.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

Figure 1:
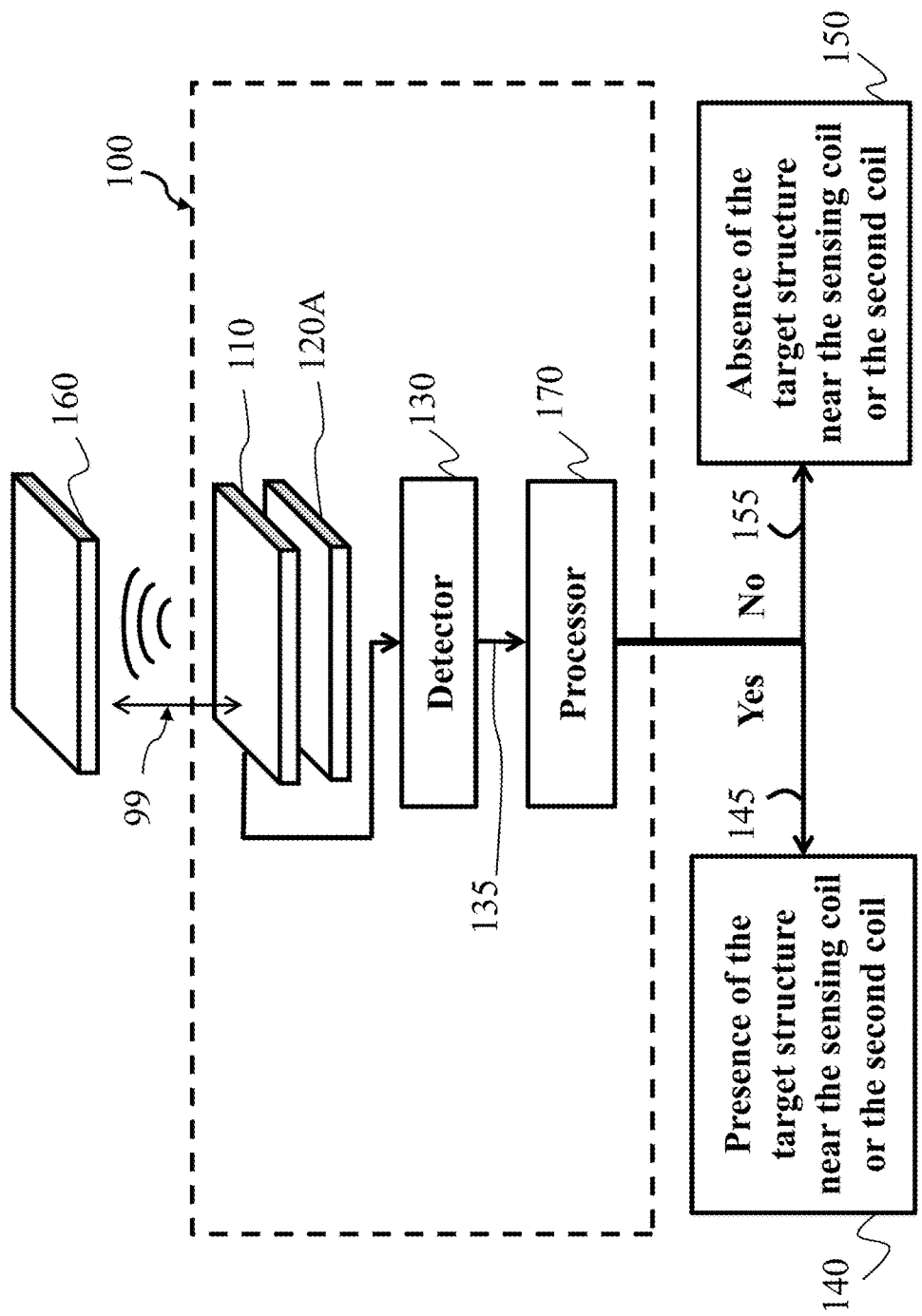
FIG. 1 is a schematic of a sensor according to one embodiment of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

FIG. 1 shows a schematic of a sensor 100 according to one embodiment of the present disclosure. The sensor 100 includes a first coil 110, e.g., a sensing coil, including an electromagnetic structure for generating an electromagnetic near-field upon receiving energy. The sensor 100 further includes a second coil 120A, e.g., a passive coil, arranged in proximity to or adjacent to the first coil 110, such that the electromagnetic near-field induces, via an inductive coupling, a current passing through first coil 110 and the second coil 120A. The sensor 100 also includes a detector 130 that may include a voltmeter for measuring data representative of a voltage across the first coil 110 or the second coil 120A.

In some embodiments, the detector 130 maybe one or more measuring devices for measuring data related to the sensing coil 110 or the second coil 120A, such as current, i.e. ohm meter, among other things. In alternative embodiments the voltage can be measured through other measurements that analytically define the voltage, e.g., the measurements of the current.

Some embodiments of the present disclosure are based on realization that a presence of external electromagnetic structure, such as a target structure 160 moving within the electromagnetic near-field of the sensing coil 110 and second coil 120A, disturbs the magnetic field and thus can be detected based on the changes in the measurements of the voltage. For example, the coupling of the target structure 160 changes the shape of the magnetic near-field, which in turn changes the current in the connected coils, i.e. sensing coil 110 and second coil 120A generated by that near-field, when in proximity of the magnetic field. Moreover, the effect of such a presence is felt within the entire near-field making such detection less sensitive to the distance (i.e. the distance or gap 99 is increased), between the sensing coil 110 and/or the second coil 120A generating the near-field and the target structure 160. In such a manner, the presence of the target structure 160 within the near field can even at a relatively great distance, from the sensing coil 110 and/or second coil 120A may be detected.

Still referring to FIG. 1, contemplated is that the second coil 120A can be positioned adjacent to or in proximity of the sensing coil 110, such that the second coil 120A induces a greater amount of an electromagnetic near-field when place adjacent to the sensing coil 110, over an amount of electromagnetic near-field generated by only having the sensing coil 110, among other things. At least one effect, among many effects, is that a gap 99 between the target structure 160 and the sensing coil 110 and the second coil 120A, is increased when compared to a gap of only having the sensing coil 110, thus allowing for an improved operation of the sensor 100.

For example, when additional coils, i.e. the second coil 120A, are tuned to the resonance frequency of the sensing coil 110, and further coupled to the sensing coil 110. The coupling between the additional coils, i.e. the second coil 120A, and the sensing coil 110 facilitates the coupling between sensing coil 110 and the target structure 160. Further, the additional coils, i.e. the second coil 120A may be a passive coil. This enhanced coupling is achieved by modifying the frequency response of the system, and the impedance as a function of frequency. At some frequencies the coupling can be stronger than before, while at other frequencies the coupling can be weaker than before. By operating at the frequency with enhanced coupling, the result can effectively improve the received signal strength by the sensing coil 110. In particular, when the coupling between the magnetic field generated by the sensing coil 110 and the magnetic field induced on the target structure 160 is increased, the modification to the impedance of the sensing coil 110 also increases correspondingly. Thus, at the same distance between the sensing coil 110 and the target structure 160, it becomes easier for the sensor 100 to detect the change due to the proximity of the target structure. Effectively, the sensing range can be expanded between the sensing coil 110 and the target structure 160, which results in providing a technological improvement of known sensor related technologies, among other things.

In particular, for the sensor to operate in accordance to the present disclosure, at least 10 percent of an outer surface area of the second coil is to be adjacent to an outer surface area of the first coil. Further contemplated, is that the second coil when positioned adjacent the first coil by one of vertically or horizontally relative to a front face of the target structure, may include at least 15%, or at least 20%, or at least 30%, of an outer surface area of the second coil that is adjacent to an outer surface area of the first coil. For example, the amount of surface area of the second coil that is adjacent to the sensing coil is directly proportional to the coupling coefficient between the two coils. This can be defined as the ratio of mutual inductance M and the square root of the multiplication of self-inductances, L1 and L2, $k=M/\sqrt{L_1 L_2}$). For example, a percentage of 15% adjacent surface area of the two coils indicates that the coupling coefficient is around 0.15. The coupling coefficient, in turn is directly related to the amount of impedance change that the second coil (120A) is able to provide.

Still referring to FIG. 1, the target structure 160 can be designed as a metallic plate, or a metallic plate with one or more slots depending upon the configured application. In this case, the sensor can typically be called an Eddy current sensor. The eddy current sensor in accordance with the present disclosure, detects the position of a metallic target or target structure 160, based on the change in coil impedance caused by the target structure 160. The amount of change in impedance is a direct function of the position of the target structure 160. However, the target structure 160 can also be another coil, which can be of an identical or different type as the sensing coil 110 or the second coil 120A. In this case, the sensor can be called an inductive sensor, wherein the inductive sensor works similar to eddy current sensor, and the target structure is an inductive coil instead of a metallic plate.

Accordingly, the presence 140 or absence 150 of the target structure 160 in proximity to the sensing coil 110 and/or second coil 120A can be determined, using a processor 170, based on detecting 145, or not detecting 155, a change 135 in a value of the voltage. It is contemplated that more than one processor 170 may be used depending on the application, such that a processor may be in communication with the sensor wirelessly or via hardwired.

Still referring to FIG. 1, in different embodiments, the sensing coil 110 can take different forms. For example, the sensing coil 110 can be wire-wound, with a larger number of turns, around a core of different shapes and materials. The core can be dielectric, such as plastics, or a magnetic core, such as iron or ferrite. the sensing coil 110 can be made by thin metallic materials such as copper on a dielectric substrate such as circuit board. A single-layer board or multi-layer board can be designed for the sensing coil 110. The sensing coil 110 can be self-resonant due to its inductance and capacitance between turns, or can be tuned to a resonance by additional components such as capacitors connected to the sensing coil 110.

Figure 2:
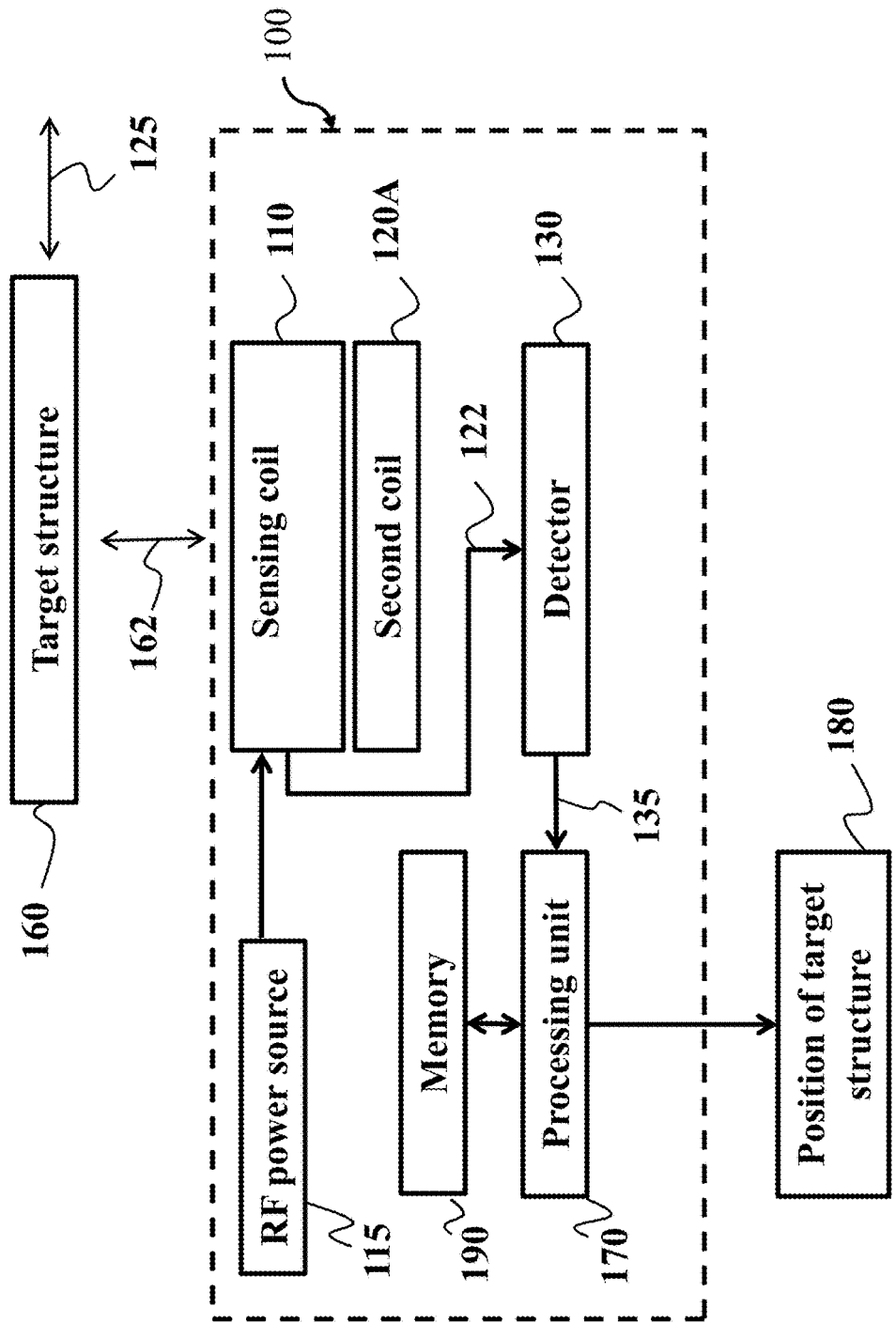
FIG. 2 is a block diagram of the sensor of FIG. 1A, the sensor is for determining a relative position of the target structure with respect to the sensor, according to the embodiment of FIG. 1.

FIG. 2 shows a block diagram of a sensor 100 of FIG. 1, for determining a relative position 180 of the target structure 160. In some implementations the target structure 160 and the sensor 100 include flat surfaces facing each other. The target structure 160 includes at least one passive resonant structure or passive structure that has resonance at a certain radio frequency $f_0$. In some embodiments, the movement of the target structure 160 can be unrestricted. In alternative embodiments, the target structure 160 can move according to a trajectory 125, e.g., in a plane parallel to the flat surface of the sensor 100.

The sensor 100 includes the sensing coil 110, the second coil 120A and the detector 130. The detector 130 may include a detecting structure (not shown). The sensing coil 110 can be an electromagnetic structure generating an electromagnetic near-field upon receiving energy, as noted above. For example, the sensing coil 110 is an electric current carrying coil.

Still referring to FIG. 2, the sensing coil 110 can be inductively coupled 122 with the detector 130 and can be integrated onto one dielectric substrate, such that the relative position of the sensing coil 110 and second coil 120A may be fixed. The sensing coil 110 can be fed by a radio frequency power source 115. For example, in one embodiment, the power source 115 can supply the energy to the sensing coil 110 via a power signal having an identical resonance frequency as the target structure 160. In this embodiment, the target structure 160 can be coupled 162 to the sensing coil 110.

Upon receiving the energy, the magnetic flux passes through each coil, sensing coil 110 and second coil 120A, and generates an induced voltage across each coil. The induced voltages of the coil pair are recorded by the detector, wherein the detector 130 can include a voltmeter, or other similar type of measurement unit. The voltage information is submitted to the processing unit 170 and the magnitudes of the voltages and/or the difference of the voltages is used to determine the position 180 of the target structure 160.

Figure 3:
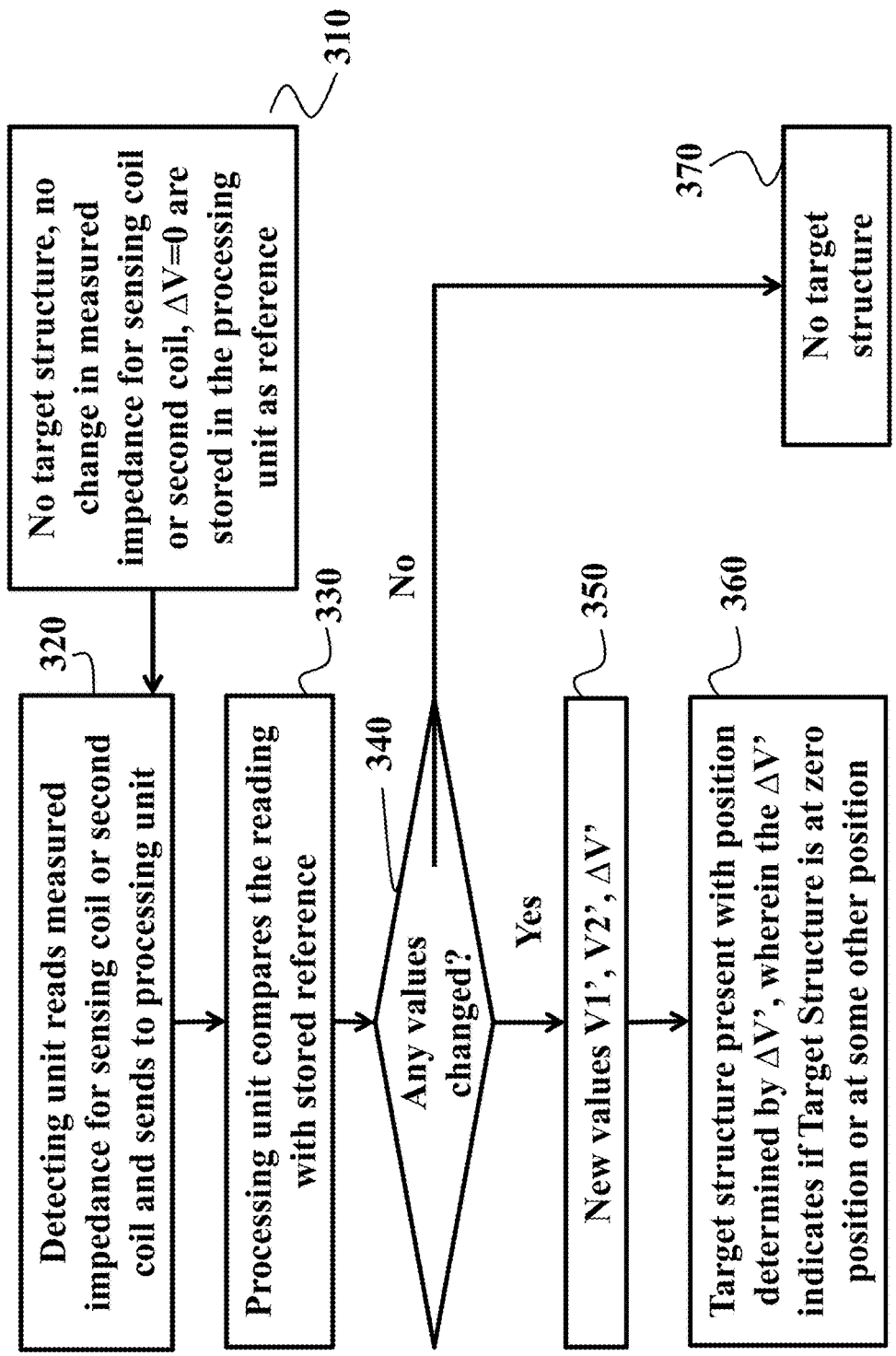
FIG. 3 is a block diagram of a method for determining the relative position of the target structure, according to embodiments of the present disclosure.

FIG. 3 shows a block diagram of a method for determining the relative position of the target structure according to one embodiment of the present disclosure. When there is no target structure in the vicinity of the sensing coil 310 or second coil, a measured voltage of V1 of the sensing coil is unchanged. Note, contemplated is that a measured voltage of V2 of the second coil can be measured to identify if there is no target structure in the vicinity of the sensing coil or second coil. The detector measures V1 of the sensing coil to detect a change in the voltage (ΔV), wherein the information can be stored 330 in the processing unit as a reference value, i.e. reference data. Note, contemplated is that the detector can measure V2 of the second coil to detect a change in the voltage (ΔV), wherein the information can be stored in the processing unit as a reference value, i.e. reference data. The sensor continuously measures 340 V1 of the sensing coil and/or V2 of the second coil to detect a change in voltage (ΔV), which are sent to the processing unit with stored reference values. If there is no change detected, then there is no target structure in range 370. If there is change in the measured values 350 of either V1 or V2, or both, then these values are analyzed by the processing unit. If either V1 and/or V2 are changed, the new change of voltage ΔV' 360 will determine the presence of the target structure along with a position of the target structure within the near field based upon reference values, i.e. reference data.

Some embodiments of the present disclosure are based on the realization that when the magnetic flux induces current through multiple coupled coils, the magnitude and/or change of the voltage of either the sensing coil and/or the second coil are indicative of the relative position of the target structure within the near field based upon reference values, i.e. reference data. For example, a trajectory of potential movement of the target structure can be sampled to determine a voltage of the coils, i.e. sensing coil and/or second coil, corresponding to a specific position of the target structure on the trajectory. Accordingly, some embodiments of the present disclosure determine a mapping between information indicative of a value of the voltages of either one or both of the coils, i.e. sensing coil and/or second coil, as a relative position of the target structure.

Figure 4:
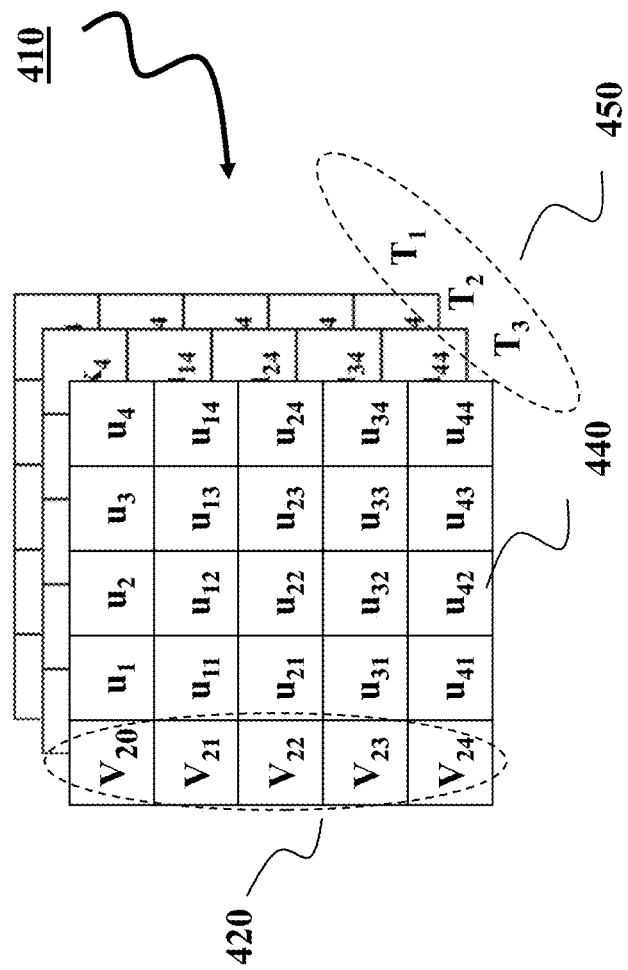
FIG. 4 is an example of a mapping of the values of the voltages and relative positions of the target structure according to some embodiments of the present disclosure.

FIG. 4 shows an example of the mapping 410 of the values of the voltages 420 of at least one coil, i.e. sensing coil and/or the second coil, and relative positions 440 of the target structure according to some embodiments of the present disclosure. In some embodiments, the mapping is determined for different positions in space around the sensor. In alternative embodiments, the mapping is determined for trajectories 450, e.g., in a plane parallel to the electromagnetic structure of the sensing coil or second coil.

For example, in one embodiment, the detector measures either a first voltage across the sensing coil and/or a second voltage across the second coil, wherein the processor determines a relative position of the target structure with respect to the sensing coil or second coil based on the value of the voltage. In some implementations, target structures move according to a trajectory in a plane parallel to the electromagnetic structure of the sensing coil, and the memory 190 stores a mapping of a set of positions of the target structure on the trajectory and a set of values of the measured voltages.

Figure 5:
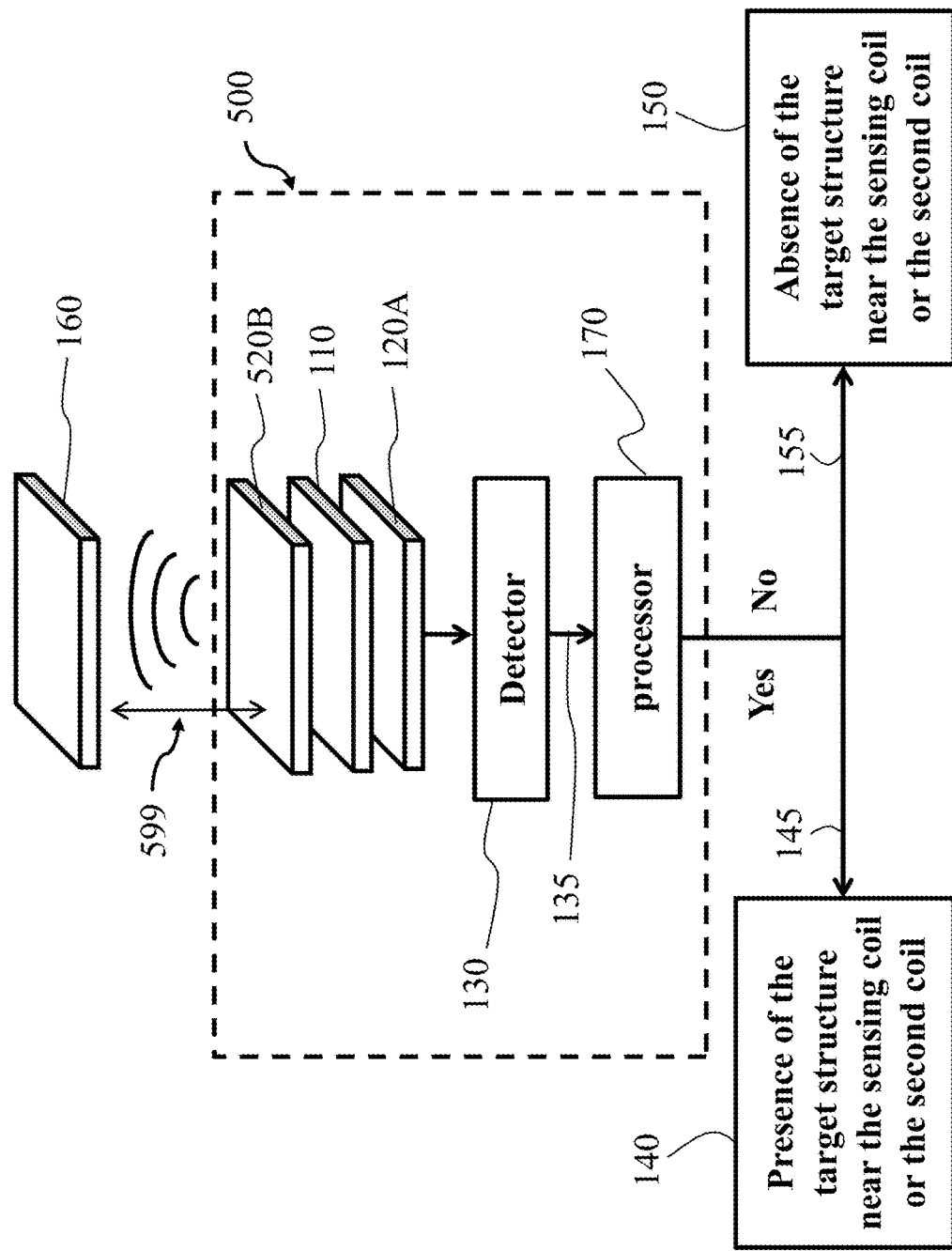
FIG. 5 is a schematic of a sensor having a second coil and a third coil, according to an embodiment of the present disclosure.

FIG. 5 shows a schematic of a sensor 500 according to another embodiment of the present disclosure. FIG. 5 shows the schematic of sensor 100 of FIG. 1, however, a third coil 520B, or an additional coil, is arranged in proximity to or adjacent the sensing coil 110, such that the electromagnetic near-field induces, via an inductive coupling, a current passing through sensing coil 110, the second coil 120A and the third coil 520B.

Contemplated by adding the third coil 520B adjacent to the sensing coil 110, is that the third coil 520B induces an increase in the electromagnetic near-field over the induced electromagnetic near-field generated by the sensing coil 110 along with the second coil 120A, among other things. At least one effect, among many effects, is that a gap 599 between the target structure 160 and the sensing coil 110, the second coil 120A and the third coil 520B, may be increased over the gap 99 of FIG. 1, thus allowing for improved operation of the sensor 500.

The position of the sensing coil 110 may be positioned between the second coil 120A and the third coil 520B, such that the second coil 120A and the third coil 520B are positioned adjacent to or in proximity to the sensing coil 110. Contemplated is that the second coil 120A may be position symmetrically opposite the third coil 520B in relation to the sensing coil 110. However, and alternatively, the second coil 120A may not be positioned symmetrically opposite the third coil 520B in relation to the sensing coil 110, such that the second coil 120A or third coil 520B can be positioned differently, but still adjacent the sensing coil 110. For example, the second coil 120A and the third coil 520B may be positioned on opposite sides of the sensing coil 110 either horizontally or vertically. Potentially, the second coil 120A and the third coil 520B may be positioned on opposite sides of the sensing coil 110, however, at least one coil of the second coil 120A and third coil 520B may be positioned offset to a side of the sensing coil 110.

Still referring to FIG. 5, for example, the coupling of the target structure 160 changes the shape of the magnetic near-field, which in turn changes the current in the connected coils, i.e. sensing coil 110, second coil 120A and third coil 520B, generated by that near-field, when in proximity of the magnetic field. Moreover, the effect of such a presence is felt within the entire near-field making such detection less sensitive to the distance (i.e. the distance or gap 599 can be increased), between the sensing coil 110 and/or the second coil 120A generating the near-field and the target structure 160. In such a manner, the presence of the target structure 160 within the near field even at a relatively great distance from the sensing coil 110 and/or second coil 120A can be detected. In other words, the distance is increased or the gap 599 is increased over that of the gap 99 of sensor 100 of FIG. 1.

Contemplated is that the second coil and third coil when positioned adjacent to the first coil by one of vertically or horizontally relative to a front face of the target structure, may include at least 15%, or at least 20%, or at least 30%, of an outer surface area of the second coil and the third coil that is adjacent to an outer surface area of the first coil. For example, the amount of surface area of the second coil and the third coil that are adjacent to the sensing coil is directly proportional to the coupling coefficient between the three coils. This can be defined as the ratio of mutual inductance M and the square root of the multiplication of self-inductances, L1 and L2, $k=M/\sqrt{L_1 L_2}$). For example, a percentage of 15% adjacent surface area of the three coils indicates that the coupling coefficient is around 0.15. The coupling coefficient, in turn is directly related to the amount of impedance change that the second coil and third coil are able to bring.

Change in Sensing Coil Impedance as Function of Target Structure Position

Figure 6A:
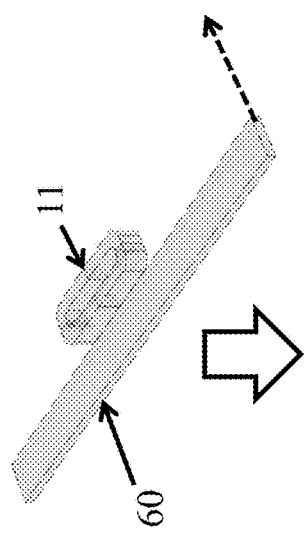
FIG. 6A shows a conventional single eddy current coil sensor, wherein the target structure is a metal plate, as known in the prior art.
Figure 6A:
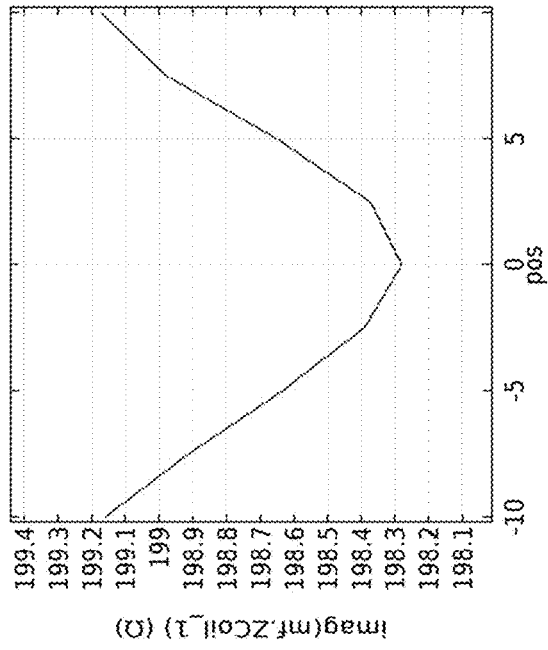
Figure 6B:
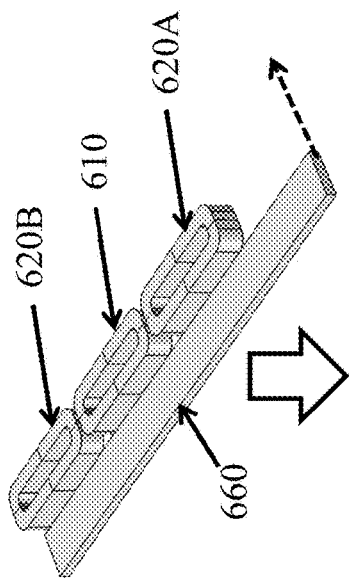
FIG. 6B shows an eddy current coil sensor positioned between a second coil and third coil, wherein the target structure is a metal plate, according to an embodiment of the present disclosure.
Figure 6B:
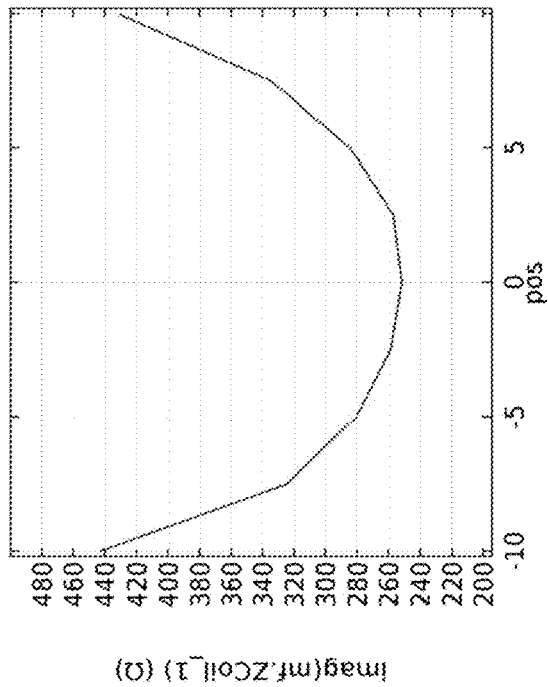

FIG. 6A and FIG. 6B show a change in sensing coil impedance as a function of a target structure position. FIG. 6A shows a conventional single eddy current coil 10 and a target structure 60. Wherein the conventional eddy current impedance, is shown as a function of the target structure 60 position. FIG. 6A shows the target structure 60 being a metal plate, and sliding along one direction as shown in the dotted line with an arrow. Approximately in the middle of the target structure 60 is where a sensing coil 10 is aligned. Upon reviewing the graph of FIG. 6A, the conventional single eddy current coil 10, without additional coils, results in an impedance change that is less than 1 Ohm.

FIG. 6B show eddy current coil impedance, as a function of the target position, in accordance with one embodiment. FIG. 6B shows an eddy current coil 610 or sensing coil, positioned between a second coil 620A and a third coil 620B, along with a target structure 660. In FIG. 6B, the eddy current impedance is shown as a function of the target structure 360 position. FIG. 6B shows the target structure 660 being a metal plate, and sliding along one direction as shown in the dotted line with an arrow. Upon reviewing the graph of FIG. 6B, the pair of coils, the second coil 620A and third coil 620B, when placed adjacent to the two sides of the sensing coil 610, and if one were to conduct the same measurement process as completed in FIG. 6A above. The measurement result would be over 100 Ohm change in impedance observed in FIG. 6B for the same change in distance as of FIG. 6A. Upon reviewing the system of the present disclosure results of the graph of FIG. 6B as compared to the results of the convention system of the graph of FIG. 6A. The system of the present disclosure of FIG. 6B shows a significant improvement in the process of determining the position of target structure over that of the conventional system of FIG. 6A. For the target structure (shown as 60 in FIG. 6A and 660 in FIG. 6B), the same change in position corresponds to a much larger change in experimentally measurable parameter (impedance) for the system of the present disclosure in FIG. 6B. Therefore, the system of the present disclosure as shown in FIG. 6B, is much easier to detect the position of target structure, and much less susceptible to noise, among other things, over the conventional system of FIG. 6A.

Figure 6D:
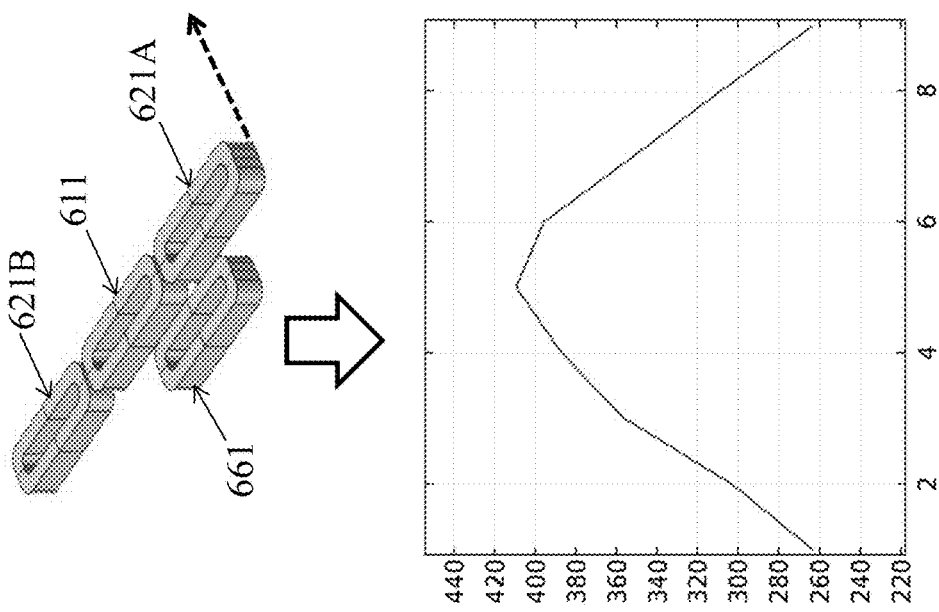
FIG. 6D shows an inductive sensor positioned between a second coil and third coil, wherein the target structure is a coil, according to an embodiment of the present disclosure.
Figure 6C:
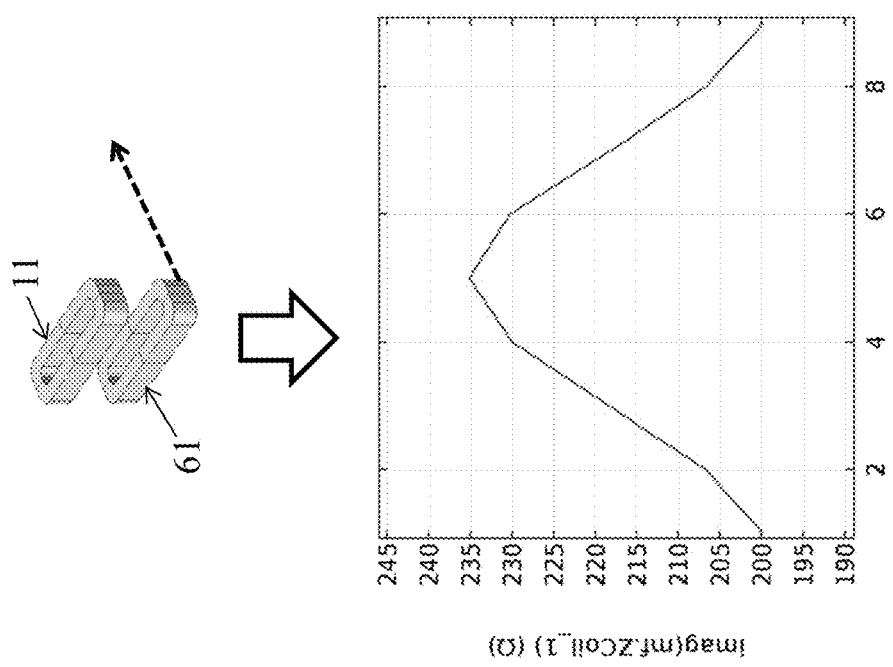
FIG. 6C shows a conventional inductive sensor, wherein the target structure is a coil, as known in the prior art.

Impedance of a Coil is a Function of Frequency and Varies Significantly Around Resonance FIG. 6C shows a conventional inductive sensor, wherein the target structure is a coil, rather than a metal plate as noted above with the conventional eddy current coil in FIG. 6A. According to embodiments, FIG. 6D shows the target structure is a coil structure. As was determined above regarding the experimental data showing an unexpected result of the system of the present disclosure of FIG. 6B, which is significantly over that of a conventional system of FIG. 6A, similar improvements in a measurable change is observed in the system of the present disclosure of FIG. 6D over the conventional system shown in FIG. 6C, using a coil structure as the target structure.

Accordingly, the inductance of a target coil as shown in FIG. 6D, is generally much higher than that of the target structure being a metal plate, which causes more significant impedance change than the case of eddy current sensor as shown in FIG. 3B. Thus, the impedance of a coil is a function of frequency and varies significantly around resonance.

FIG. 6C shows a conventional inductive coil 11 along with a target structure 61, wherein the target structure is a coil. In FIG. 6C, the measurable change is about 17% when the target structure is moving from a position away from the sensing structure 11, to a position aligned with the sensing structure 11.

FIG. 6D shows an inductive coil 611 positioned between a second coil 621A and a third coil 621B along with a target structure 661, wherein the target structure is a coil, in accordance with one embodiment. Upon reviewing the graph of FIG. 6D, the pair of coils, the second coil 621A and third coil 621B, when added to the sensing coil 611, the observed impedance is much higher than the conventional single inductive coil 11 of FIG. 6C. In FIG. 6D, the measurable change is about 50% when the target structure 661 is moving from a position away from the sensing structure 661, to a position aligned with the sensing structure 661. Thus, shown from the experimental data, the system of the present disclosure of FIG. 6D provides an unexpected result that is significantly over that of the conventional system of FIG. 6C, using the coil structure as the target structure.

Still referring to FIG. 6D, as noted above, the impedance of a coil is a function of frequency and varies significantly around resonance. The additional coils, the second coil 621A and third coil 621B, when coupled to the sensing coil 611, with induced current in each coil of different amplitude and phase, generates magnetic field of different amplitude and phase. These induced magnetic fields super-imposes onto the magnetic field from the sensing coil 611, causing significant change in impedance. Thus, the results of the system shown in FIG. 6D, is a significant improvement in the process of determining the position of target structure, among other things, over the conventional system of FIG. 6C. For the target structure (shown as 61 in FIG. 6C and 661 in FIG. 6D), the same change in position corresponds to a much larger change in experimentally measurable parameter (impedance) for the system of the present disclosure in FIG. 6D. Therefore, the system shown in FIG. 6D, can easier to detect the position of target structure, and is less susceptible to noise, among other things.

Still referring to FIG. 6D, by using an additional pair of coils alongside the sensing coil, the magnetic field over the frequency spectrum can be modified, at some frequency range, the field strength at target structure coil is enhanced. Noted, is that the pair of coil may be parasitic coils or passive coils.

Figure 6E:
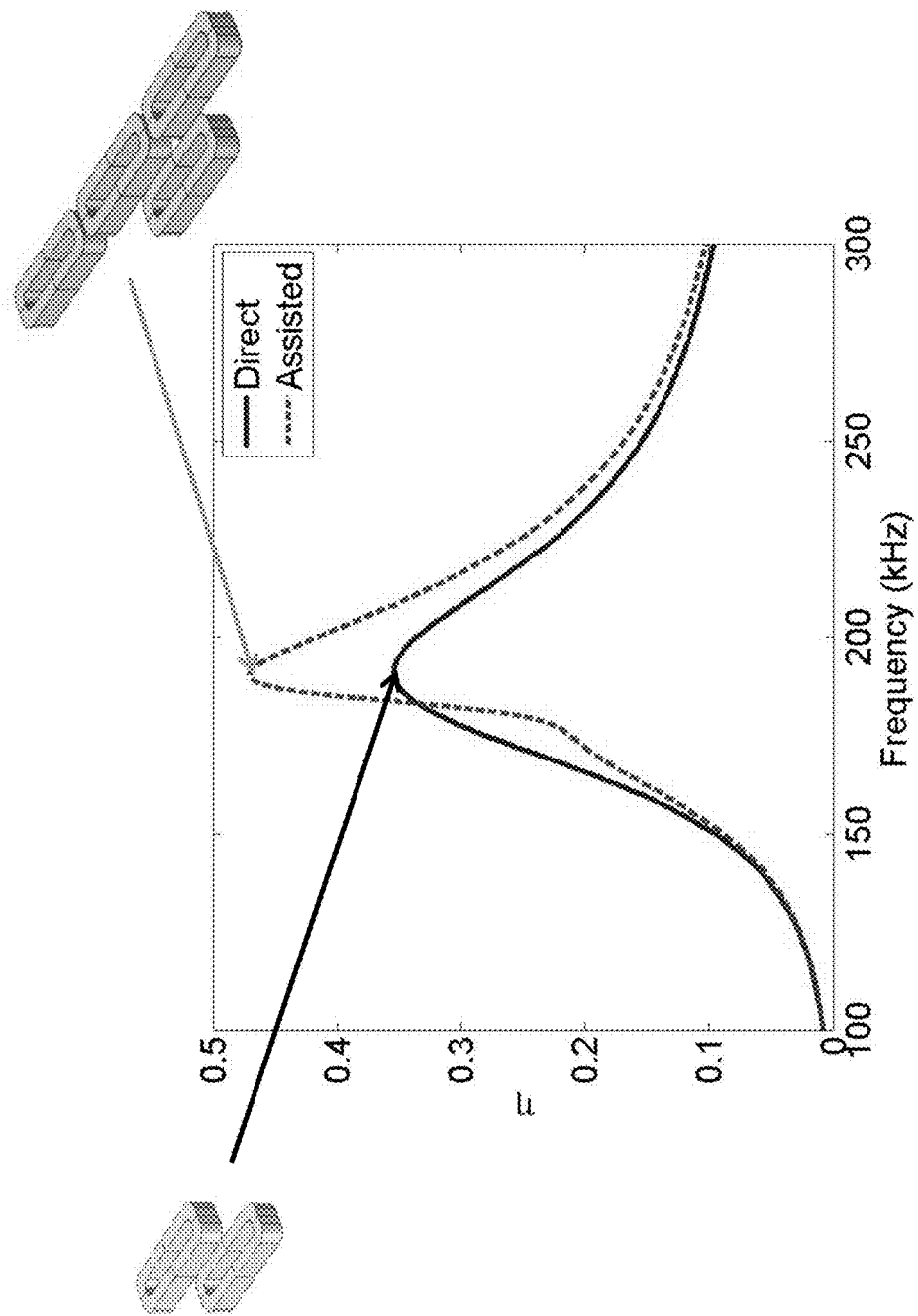
FIG. 6E shows the configuration of FIG. 3D results in the spectrum of received signal strength being modified by the pair of coils, due to the additional coupling terms, according to an embodiment of the present disclosure.

FIG. 6E shows that the configuration of FIG. 6D having a sensing coil positioned between a second coil and a third coil approximate a coil target structure, results in the spectrum of received signal strength being modified by the pair of coils, the second coil and third coil, due to the additional coupling terms. Wherein, the peak is also higher, indicating stronger coupling to the target coil. Thus, by operating at the peak frequency, it is possible to achieve higher signal strength with the additional coils.

Contemplated is that the sensing coil can be a single turn square loop of copper wire, which is connected to a power source at the two terminals. Further the sensing coil may be a multi-turn copper coil, which can be placed on a printed circuit board as second coil, by non-limiting example. Further still, the sensing coil can be formed by metallic wires of multiple turns, which can be of thin and flat forms as used in printed circuit boards or can be built by stranded wires or Litz wires. The sensing coil can have different geometrical patterns. Noted, is that the second coil and the target coil may be identical as the sensing coil. The second coil may be identical in geometry as the sensing coil, or may be different. The target structure may be a coil having the identical geometry as the sensing coil, or may be a different coil, or may not be in a coil form at all, i.e. metal plate, a slit, etc.

Figure 7:
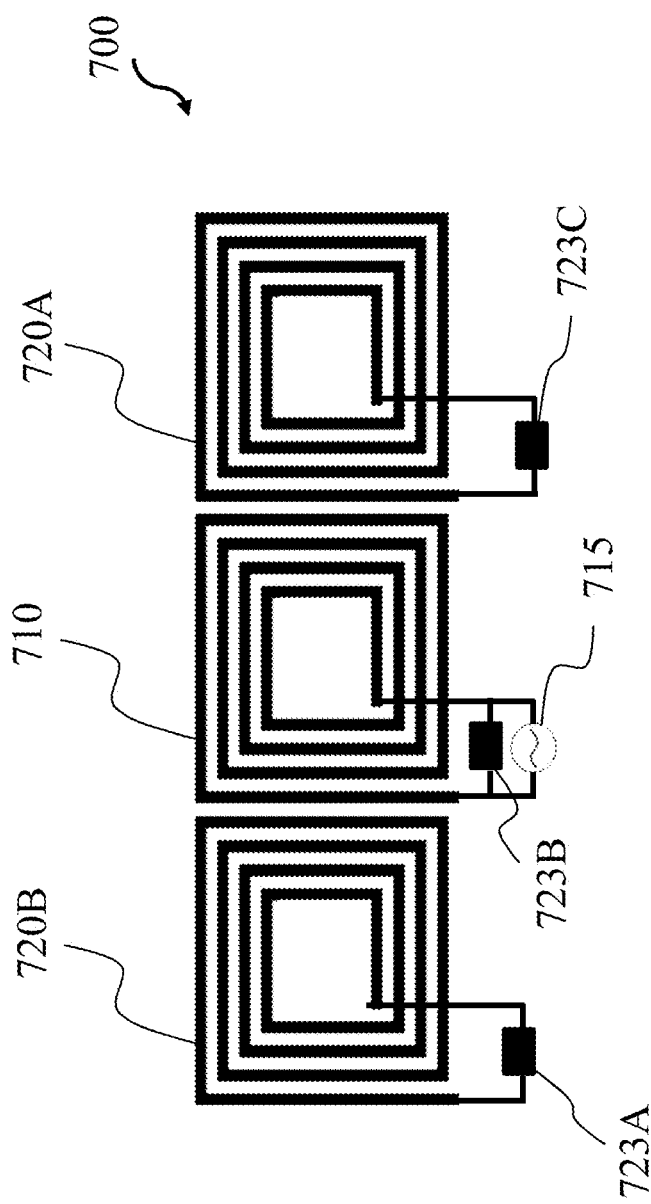
FIG. 7 is an example of a sensing coil for eddy current or inductive sensing, according to embodiments of the present disclosure.

FIG. 7 is an example of a sensor 700 for eddy current or inductive sensing, according to embodiments of the present disclosure. The sensing coil 710 can be a planar multi-turn spiral structure, connected to a capacitor 723B, and excited by a high frequency power source 715. According to embodiments of the present disclosure, one or more additional coils, i.e. second coil 720A and third coil 720B, are placed adjacent the excited sensing coil 710. The second coil 720A and third coil 720B are tuned to a resonant frequency similar to the sensing coil 710.

Figure 8:
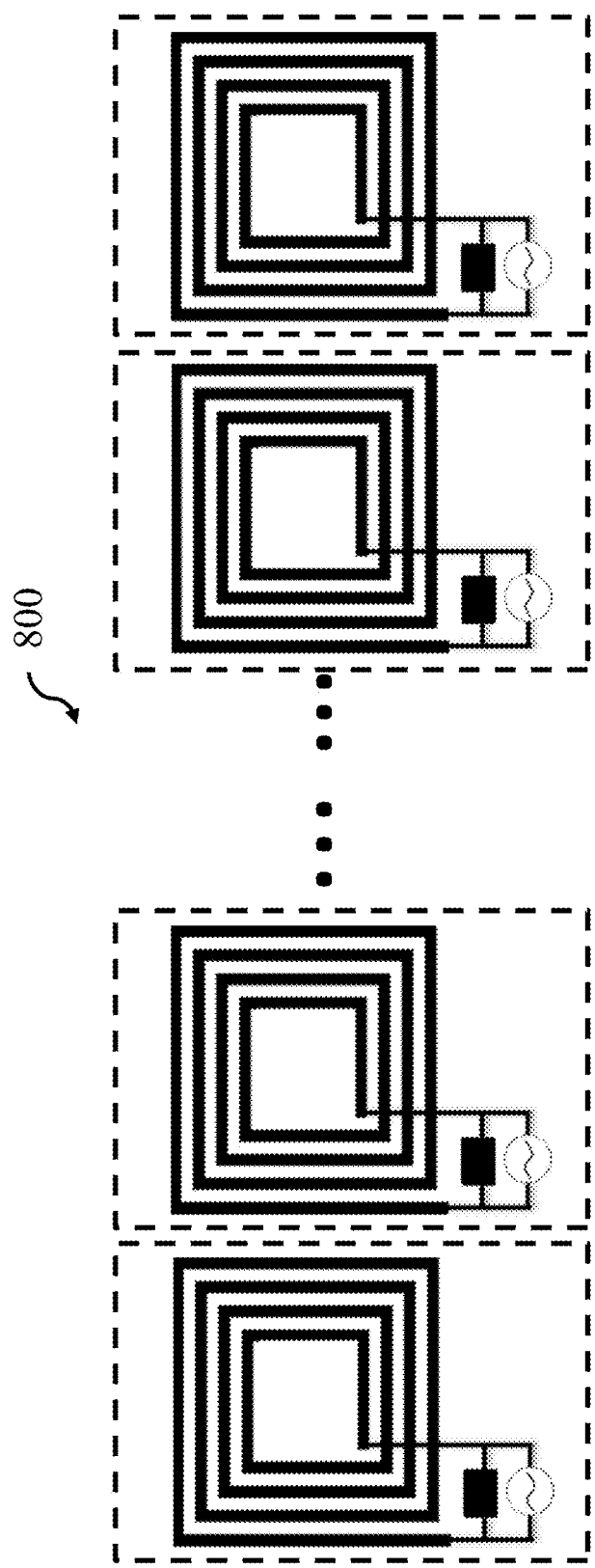
FIG. 8 and FIG. 9 illustrate examples of multiple sensors of FIG. 7, the multiple sensors may be for eddy current or inductive sensing, according to embodiments of the present disclosure.
Figure 9:
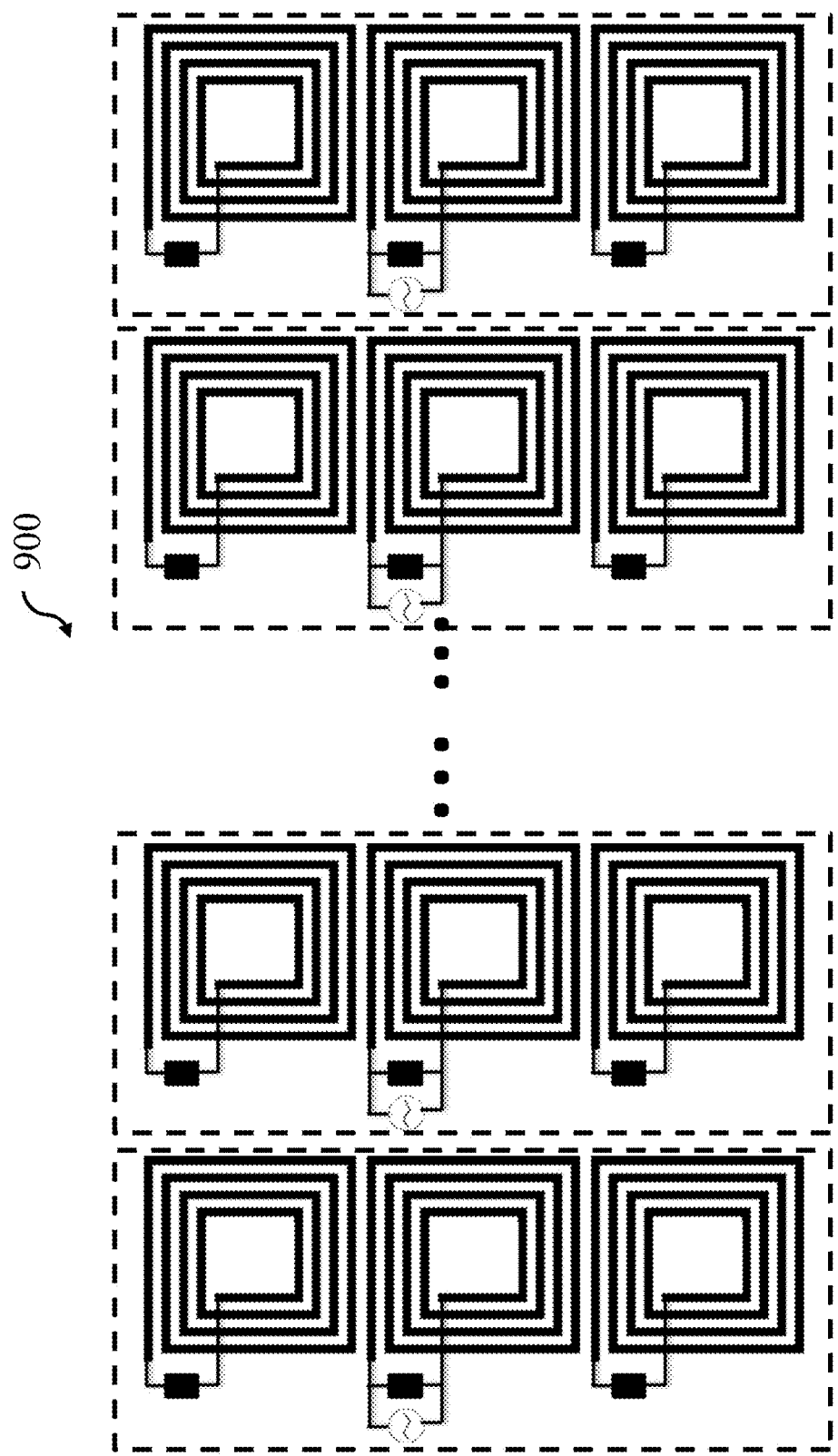

FIG. 8 and FIG. 9 are examples of multiple sensors of FIG. 7, the multiple sensors 800, 900 may be for eddy current or inductive sensing, according to embodiments of the present disclosure. For example, FIG. 8 shows multiple eddy current sensors or inductive sensors arranged in an array. Each sensor in the array provides a reading depending on the target structure. The target structure can be a metal plate of multiple slots in the case of eddy current sensor. In the case of inductive sensor, the target can be multiple coils arranged in an array. The position information can be encoded in the target structure. Wherein each sensor in the array provides a reading depending on the relative position to the target structure. Thus a code can be generated by the readings of all sensors in the array. For example, when the target structure moves, a new code can be obtained by the multiple sensing coils. For such sensor arrays, the proposed method can also be applied to enhance the performance of each sensor in the array, as shown in FIG. 9. For each sensor, the analog reading is converted to digital signal of 0 or 1, depending on the amplitude of the reading. So at each position, a sensor has a coding bit of 0 or 1. When multiple sensors are included in the sensing system, each sensor has a different reading, due to that their relative positions to the target structure are different. Thus each sensor generates a coding bit of 0 or 1, and by putting the readings together, provides for a result in obtaining a coding sequence at each position. Further, according to aspects of the present disclosure, the system results in improving signal strength, and a signal-to-noise ratio, so that accuracy can be improved, among other things.

According to the present disclosure the set of coils can be an array of coils, wherein energy provided to the array of coils is from at least one power source via a power signal having a resonance frequency. Further, the processor detects a presence of a target structure within an array of target structures in proximity to each set of coils of the array of coils upon detecting a change in a value of the voltage. Further still, each target structure of the array of target structures is an electromagnetic structure moving at a distance from set of coils of the array of coils, such that each set of coils in the array of sensors provides a positional reading depending on a relative position within the array of target structures, wherein a code can be generated by a reading of each one set of coils in the array of sensors.

In some embodiments, the structures can be identical or different designs, and can have identical or different resonant frequencies. The induced magnetic field on the target structure is different at different positions, and impacts the induced voltages differently. Thus the target structure serves as a scale corresponding to different positions, and can be utilized by the sensor to determine the position information. For example, three measurement channels can determine a position of the target structure independently. Thus the additional channels can serve as redundancy as the first channel. In case there is an object in the vicinity of one channel and impacting the measurement, the redundant channels help obtain the correct position information. Because the relative positions between the three measurement channels are known, the multiple channels can also work together and serve as part of a linear encoder.

The above-described embodiments of the present disclosure can be implemented in any of numerous ways. For example, the embodiments may be implemented using hardware, software or a combination thereof. Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A sensor, comprising:
   a set of coils, the set of coils include a first coil and a second coil, wherein the first coil upon receiving energy, generates an electromagnetic near-field, such that the electromagnetic near-field provides at least a portion of the energy to the second coil through inductive coupling, inducing a current to pass through the set of coils;
   a detector for measuring a voltage across at least one of the first coil or the second coil; and
   a processor for detecting a presence of a target structure in proximity to the set of coils upon detecting a change in a value of the voltage, wherein the target structure is an electromagnetic structure moving at a distance from the set of coils, wherein one of the first coil, the second coil or both, are in communication with the detector, the detector includes a voltmeter that detects a voltage across, one of, the first coil, the second coil or both, such that the value of the voltage measured by the voltmeter represents, one of, a first voltage across the first coil, a second voltage across the second coil or both the first voltage across the first coil and the second voltage across the second coil, and wherein the processor determines a relative position of the target structure with respect to, one of, the first coil, the second coil or both the first coil and the second coil, based on the value of the voltage.

2. The sensor of claim 1, wherein each coil of the set of coils are identical, wherein the target structure includes a target coil identical to each coil in the set of coils.

3. The sensor of claim 1, further comprising:
a power source for supplying the energy to the first coil via a power signal having a resonance frequency, wherein each coil of the set of coils is an electromagnetic structure with a resonant frequency.

4. The sensor of claim 1, wherein the second coil has a resonance frequency approximate a resonance frequency of the first coil, such that the first coil is a sensing coil and the second coil is a passive coil.

5. The sensor of claim 1, wherein the target structure moves according to a trajectory in a plane parallel to, one of, the first coil, the second coil or both the first coil and the second coil, further comprising:
a memory storing a mapping between a set of positions of the target structure on the trajectory and a set of values of the voltages, wherein the processor determines the relative position of the target structure using the mapping.

6. The sensor of claim 1, wherein the set of coils have identical shape such that, one of, the first voltage, the second voltage or both the first voltage and the second voltage, are below a threshold when the target structure is outside the electromagnetic near-field.

7. The sensor of claim 1, wherein the processor determines the relative position of the target structure to be aligned with the set of coils if, a magnitude of one of, the first voltage, the second voltage or both the first voltage and the second voltage, during the presence of the target structure within the electromagnetic near field is less than or greater than, a magnitude of one of, the first voltage, the second voltage or both the first voltage and the second voltage, when the target structure is outside the electromagnetic near-field.

8. The sensor of claim 1, wherein the processor compares magnitudes of, one of, the first voltage, the second voltage or both the first voltage and the second voltage, with reference voltages to detect a presence of the target structure within the electromagnetic near field.

9. The sensor of claim 1, wherein the set of coils includes a third coil, the third coil and the second coil are adjacent to the first coil, such that the third coil and the second coil have resonance frequencies approximate a resonance frequency of the first coil.

10. The sensor of claim 9, wherein the first coil is positioned between the second coil and the third coil by one of vertically or horizontally relative to a front face of the target structure, such that at least 15% of an outer surface area of each of the second coil and third coil are adjacent to an outer surface of the first coil, or at least 20% of an outer surface area of each of the second coil and the third coil are adjacent to the outer surface of the first coil, or at least 30% of an outer surface area of each of the second coil and the third coil are adjacent to the outer surface of the first coil.

11. A sensor, comprising:
a set of coils, the set of coils includes a first coil and a second coil, wherein the first coil upon receiving energy, generates an electromagnetic near-field, such that the electromagnetic near-field provides at least a portion of the energy to the second coil through inductive coupling, inducing a current to pass through the set of coils, wherein at least 10% of an outer surface area of the second coil is adjacent to an outer surface of the first coil;
a detector for measuring a voltage across at least one of the first coil and second coil or both; and
a processor for detecting a presence of a target structure in proximity to the set of coils upon detecting a change in a value of the voltage, wherein the target structure is an electromagnetic structure moving at a distance from the set of coils, wherein one of the first coil, the second coil or both, are in communication with the detector, the detector includes a voltmeter that detects a voltage across, one of, the first coil, the second coil or both, such that the value of the voltage measured by the voltmeter represents, one of, a first voltage across the first coil, a second voltage across the second coil or both the first voltage across the first coil and the second voltage across the second coil, and wherein the processor determines a relative position of the target structure with respect to, one of, the first coil, the second coil or both the first coil and the second coil, based on the value of the voltage.

12. The sensor of claim 11, wherein the target structure moves according to a trajectory in a plane parallel to one of the first coil, the second coil or both the first coil and the second coil, further comprising:
a memory storing a mapping between a set of positions of the target structure on the trajectory and a set of values of the voltages, wherein the processor determines the relative position of the target structure using the mapping.

13. The sensor of claim 11, wherein the processor determines the relative position of the target structure to be aligned with the set of coils if, a magnitude of one of, the first voltage, the second voltage or both the first voltage and the second voltage, during the presence of the target structure within the electromagnetic near field is less than or greater than, a magnitude of one of, the first voltage, the second voltage or both the first voltage and the second voltage, when the target structure is outside the electromagnetic near-field.

14. The sensor of claim 13, wherein the processor compares magnitudes of, one of, the first voltage, the second voltage or both the first voltage and the second voltage, with reference voltages to detect a presence of the target structure within the electromagnetic near field.

15. The sensor of claim 11, wherein at least one coil of the set of coils is a different type of coil from other coils of the set of coils, such that the target structure is a coil and is one of an identical type of coil as the set of coils or a different type of coil than the set of coils.

16. The sensor of claim 11, wherein the set of coils is an array of coils, wherein the energy provided to the array of coils is from at least one power source via a power signal having a resonance frequency;
wherein the processor detects a presence of a target structure within an array of target structures in proximity to each set of coils of the array of coils upon detecting a change in a value of the voltage, wherein each target structure of the array of target structures is an electromagnetic structure moving at a distance from set of coils of the array of coils, such that each set of coils in the array of sensors provides a positional reading depending on a relative position within the array of target structures, such that a code is generated by a reading of each one set of coils in the array of sensors.

17. The sensor of claim 16, wherein upon a movement of the target structure, a new code is obtained by the array of coils, wherein each target structure includes positional related information encoded in each target structure of the array of target structures.

18. A method of determining a presence and/or a relative position of a target structure in a proximity to a sensor, the sensor includes a set of coils, the set of coils include a first coil and a second coil, such that the first coil upon receiving energy, generates an electromagnetic near-field, wherein the electromagnetic near-field provides at least a portion of the energy to the second coil through inductive coupling, inducing a current to pass through the set of coils, and wherein a detector for measuring a voltage across at least one of the first coil or the second coil, the method comprising:

using a processor for detecting a presence of a target structure in proximity to the set of coils upon detecting a change in a value of the voltage, wherein the target structure is an electromagnetic structure moving at a distance from the set of coils;

recording, by the processor, if there is no change in the value of the voltage for the set of coils and storing in a memory, wherein the memory is in communication with the processor;

detecting, by a detecting unit, a measured value of the voltage of the set of coils, and sending the measured value of the voltage of the set of coils to the processor;

comparing, by the processor, the measured value of the voltage of the set of coils with historically stored reference values;

determining, by the processor, if there is no change in the value of the voltage for the set of coils, if no change, then no presence and/or no relative position of the target structure in the proximity to the sensor;

determining, by the processor, if there is detected change in the value of the voltage for the set of coils, upon determining the detected change, then the target structure is present and a position of the target structure is determined by an amount of change in value of the voltage of the set of coils, indicating if the target structure is at a zero position or at another position.

\* \* \* \* \*